(12) United States Patent
Bekke

(10) Patent No.: US 9,374,897 B2
(45) Date of Patent: Jun. 21, 2016

(54) PRINTED WIRING BOARD

(71) Applicant: FANUC Corporation, Yamanashi (JP)

(72) Inventor: Makoto Bekke, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 14/823,519

(22) Filed: Aug. 11, 2015

(65) Prior Publication Data

US 2016/0050754 A1 Feb. 18, 2016

(30) Foreign Application Priority Data

Aug. 12, 2014 (JP) .................................. 2014-164570

(51) Int. Cl.
 *H05K 1/11* (2006.01)
(52) U.S. Cl.
 CPC ...... *H05K 1/115* (2013.01); *H05K 2201/09545* (2013.01)
(58) Field of Classification Search
 CPC ............. H05K 1/11; H05K 3/02; H05K 3/34; H05K 3/42; H01L 23/04; H01L 23/48; H01L 23/58; H01L 23/64
 USPC ........ 174/262, 260.264, 266; 361/306.3, 764; 228/101; 257/440, 448, 466, 698
 See application file for complete search history.

(56) References Cited

U.S. PATENT DOCUMENTS

| | | | | |
|---|---|---|---|---|
| 5,526,249 | A * | 6/1996 | Karasawa et al. | 362/362 |
| 6,370,013 | B1 * | 4/2002 | Iino et al. | 361/306.3 |
| 2006/0152334 | A1 * | 7/2006 | Maercklein et al. | 338/210 |
| 2007/0029108 | A1 * | 2/2007 | Nakao et al. | 174/260 |
| 2007/0205251 | A1 * | 9/2007 | Suzuki et al. | 228/101 |
| 2007/0257355 | A1 * | 11/2007 | Suzuki et al. | 257/698 |
| 2008/0007927 | A1 * | 1/2008 | Ito et al. | 361/764 |
| 2009/0152664 | A1 * | 6/2009 | Klem et al. | 257/440 |

FOREIGN PATENT DOCUMENTS

| | | |
|---|---|---|
| JP | 2-42794 A | 2/1990 |
| JP | 2007-235044 A | 9/2007 |
| JP | 2007-305615 A | 11/2007 |
| JP | 2009-130262 A | 6/2009 |
| JP | 2012-146903 A | 8/2012 |

OTHER PUBLICATIONS

Decision to Grant a Patent mailed Oct. 6, 2015, corresponding to Japanese Patent Application No. 2014-164570.

* cited by examiner

*Primary Examiner* — Xiaoliang Chen
(74) *Attorney, Agent, or Firm* — Hauptman Ham, LLP

(57) ABSTRACT

A printed wiring board includes three or more than three through holes. An inner wall of the through hole is covered by conductive coating. Same size leads of an electronic component are inserted into the through holes. The through holes are soldered by dip soldering the printed wiring board in melting solder. The through holes have two or more diameters. The diameter of the through hole having more adjacent through holes is not larger than the diameter of the through hole having less adjacent through holes.

2 Claims, 4 Drawing Sheets

(a)

(b)

(c)

(a) COMPONENT WITH MANY ADJACENT PINS (b) COMPONENT WITH FEW ADJACENT PINS (a) TOP VIEW OF PRINTED WIRING BOARD WITH THROUGH HOLES CORRECPONDING TO PINS OF CONNECTORS ARRANGED WITH 2.54 mm PITCH (b) TOP VIEW OF PRINTED WIRING BOARD WITH THROUGH HOLES CORRECPONDING TO PINS OF SOCKETS ARRANGED WITH 2.54 mm PITCH (a) WITH THROUGH HOLE FOR HEAT TRANSFER (b) WITHOUT THROUGH HOLE FOR HEAT TRANSFER

PRINTED WIRING BOARD

RELATED APPLICATIONS

The present application claims priority to Japanese Application No. 2014-164570, filed Aug. 12, 2014, the disclosure of which is hereby incorporated by reference herein in its entirety.

BACKGROUND OF THE INVENTION

1. Field of the Invention

The present invention relates to a printed wiring board, which can be soldered by dip soldering in a melting solder with sufficient solder wetting and high density wiring between pins.

2. Description of the Related Art

Recent improvement of consciousness to the environment has promoted a shift from conventional lead containing solder to leadless solder. But, there is a problem that, in dip soldering of a lead insert component, sufficient solder wetting is not secured with a conventional printed wiring board design, since the leadless solder has higher melting point than the lead containing solder.

There are following patent literatures as techniques to solve the problem above mentioned.

Japanese Patent Application Laid-Open No. 2007-305615 discloses a printed wiring board provided with through holes around a pin, in that heat transfer, from the solder which flows into the through holes, improves the solder wetting. FIGS. 5A and 5B are views explaining Japanese Patent Application Laid-Open No. 2007-305615 and show a plane on which electronic components are mounted. FIG. 5A shows a printed wiring board provided with a through hole for heat transfer, and FIG. 5B shows a printed wiring board not provided with a through hole for heat transfer. FIG. 5A shows that heat transfer from the through holes 14 for heat transfer heats the printed wiring board 10. The temperature of the printed wiring board 10 becomes higher as it approaches the center of broken line part.

An electronic component shown by line 16 is mounted on the printed wiring board 10. The printed wiring board 10 is provided with a through holes 12 into which leads of the electronic component are inserted and a through holes 14 for heat transfer.

The through holes 14 are insulated. In soldering, solder filled in the through holes 14 heats the printed wiring board 10, achieving a sufficient wetting of the through holes 12.

Japanese Patent Application Laid-Open No. 2012-146903 discloses a printed wiring board having elliptic through holes except for through holes corresponding to the edge pins, to easily fill solder on the elliptic through holes, and the through holes for heat transfer corresponding to the edge pins to secure sufficient solder wetting. FIG. 6 is a view explaining Japanese Patent Application Laid-Open No. 2012-146903. A printed wiring board 20 is provided with edge side through holes 24, inner side through holes 22, through holes for heat transfer 26. Edge side leads of a plurality of leads of an electronic component to be mounted on the board are inserted into the edge side through holes 24, while inner side leads of the same are inserted into the inner side through holes 22. The through holes for heat transfer 26 are provided near the edge side through holes 24, so that solder filled in the through holes for heat transfer 26 heats the printed wiring board 20 to secure sufficient solder wetting, in soldering. The inner side through holes 22 other than the edge side through holes 24 are elliptic, so that the amount of solder which flows into the inner side through holes 22 is increased to secured sufficient wetting.

Japanese Patent Application Laid-Open No. 2009-130262 discloses a printed wiring board increasing heat flow from solder on the enlarged solder side land to secure sufficient solder wetting. FIG. 7 is a view explaining Japanese Patent Application Laid-Open No. 2009-130262.

Components side lands 32 and solder side lands 34 are provided on the through hole 31 of a printed wiring board material portion 33 of a printed wiring board 30. A lead 36 of a component is inserted into the through hole 31. The area of the solder side land 34 is larger than the area of the components side land, so that heat transfer from the solder to the land is increased to heat the through hole 31, achieving sufficient wetting. Numeral "35" denotes the solder.

Japanese Patent Application Laid-Open No. 2007-235044 discloses a printed wiring board provided with not less than four time area of an opening of a through hole than the cross sectional area of a lead, to secure sufficient solder wetting. FIG. 8 is a view explaining Japanese Patent Application Laid-Open No. 2007-235044. A through hole 42 is provided in a printed wiring board 40. The through hole 42 is provided with a land 44. A lead 46 is inserted into the through hole 42. Not less than four times cross section area of the through hole 42 than the cross section area of the lead 46 enables sufficient solder wetting.

However, in Japanese Patent Application Laid-Open No. 2007-305615 and Japanese Patent Application Laid-Open No. 2012-146903, the through hole for heat transfer is added, and wiring area is narrowed, leading to a defect in that dense wiring between the pins is difficult for a multipin component. Japanese Patent Application Laid-Open No. 2009-130262 has a problem that narrowed land spacing on the solder side may induce a solder bridge defect for the multipin component. In Japanese Patent Application Laid-Open No. 2007-235044, all the through holes are enraged according to the lead diameters, such that looseness of the component to the printed wiring board is increased and it is difficult to position the component. Japanese Patent Application Laid-Open No. 2007-235044 includes the problem that narrowed land spacing may induce a solder bridge defect for the multipin component as in Japanese Patent Application Laid-Open No. 2009-130262.

SUMMARY OF THE INVENTION

The object of the invention is to provide a printed wiring board which secure the sufficient solder wetting by dip soldering in melting solder and dense wiring between pins.

A printed wiring board according to the present invention includes three or more than three through holes. An inner wall of the through hole is covered by conductive coating. Same size leads of an electronic component are inserted into the through hole. The through hole is soldered by dip soldering in melting solder. The three or more than three through holes have two or more diameters, and the diameter of the through hole having more adjacent through holes is not larger than the diameter of the through hole having less adjacent through holes.

The adjacent through hole may be a through hole having the least distance between a center of the through hole and a center of the adjacent through hole.

The present invention with the above configuration can provide a printed wiring board which secure the dense wiring between the pins, and sufficient solder wetting.

BRIEF DESCRIPTION OF THE DRAWINGS

The above-described object, the other object, and the feature of the invention will be proved from the description of embodiments below with reference to the accompanying drawings. In these drawings.

DETAILED DESCRIPTION OF THE PREFERRED EMBODIMENTS

Figure 1A:
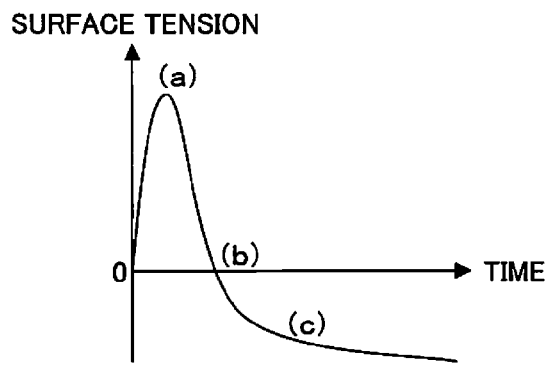
FIGS. 1A, 1B, 1C, and 1D are views showing a solder wetting in a through hole provided in the printed wiring board.
Figure 1B:
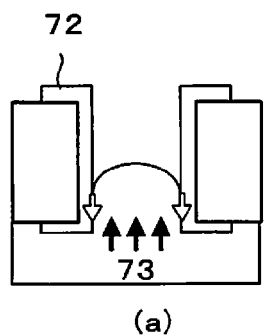
Figure 1C:
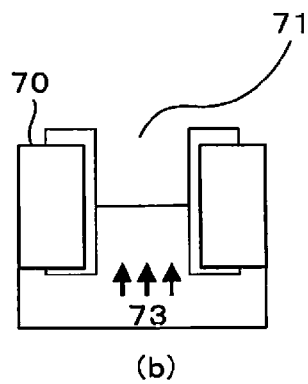
Figure 1D:
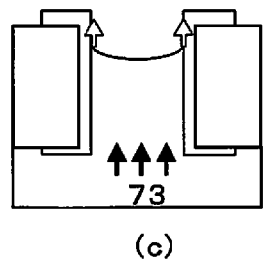

The present embodiment relates to a printed wiring board with predetermined diameters of through holes into which leads of the same diameter of an electronic component to be mounted are inserted. In the printed wiring board, through holes corresponding to number of the pins are arranged in narrow area, for a multipin electronic component to be mounted. Inner wall of the through hole is covered by a conductive coating. Solder filled in the through hole heats the printed wiring board, so it improves solder wetting even for a small through hole with small cross section. Making use of this, diameters of the through hole provided in the printed wiring board is adjusted according to pin arrangement (lead arrangement) around the through hole (lead) of the electronic component, to secure sufficient solder wetting and dense wiring. This configuration suppresses solder bridge connection and looseness of components, and secures sufficient solder wetting without preventing high density mounting.

For a printed wiring board provided with a through hole into which a lead of an electronic component is inserted, in general, after reflow process to mounting a surface mounting type electronic component, insertion type electronic component such as an electronic component of a connector or a socket is mounted in the dip soldering process. In the dip soldering process, a lead of the insertion type electronic component to be mounted on the printed wiring board is inserted into a through hole in advance, the printed wiring board is moved in melting solder bath to make melting solder contacts a soldering surface of the printed wiring board. Then solder fills the through hole to mount the electronic component.

FIGS. 1A, 1B, 1C, and 1D are views showing a solder wetting in a through hole provided in the printed wiring board. FIGS. 1A, 1B, 1C, and 1D are views showing the way of filling solder in the through hole by dip soldering, in addition to the time variation of surface tension acting on solder and an inner wall of the through hole.

(a) Pressure of solder flow, or pressure of solder corresponding to the submersion depth of the printed wiring board, make solder flow into the through hole. The amount of the solder to flow into the through hole depends on balance between the pressure and, the surface tension of the inner wall of the through hole and the melting solder.

(b) The surface tension acting against the pressure of the solder is reduced, and the inner wall of the through hole begins to be wet. Here, numeral "72" denotes a through hole land, and "73" denotes pressure of solder in FIG. 1B.

(c) The direction of the surface tension changes from the direction against the pressure of the solder to the direction expanding the wetting of the inner wall of the through hole, and the inner wall of the through hole is wetted by solder. Here, numeral "70" denotes a printed wiring board material portion, and numeral "71" denotes the through hole.

In (a) above mentioned, force of solder to flow into the through hole depends on the horizontal cross section area of the through hole, so large amount of solder flows into the through hole with large horizontal cross section area of the through hole. The printed wiring board takes heat the solder flowed into the through hole through the inner wall of the through hole, but reduction of solder temperature is small when large amount of solder flows into the through hole in (a).

The temperature of the solder affects time duration to complete the procedures (a) to (c), and the higher temperature leads to shorter time duration. The time duration of the soldering has the upper limit from heat resistance or the like of components. The time duration to complete the procedures (a) to (c) is short, sufficient solder wetting is secured without exceeding the upper limit of the time duration of soldering in many cases, so the larger cross section of the through hole is advantageous for solder wetting.

Figure 2A:
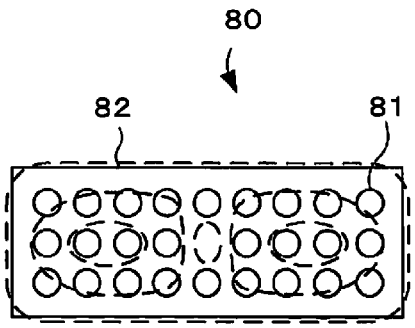
FIGS. 2A and 2B are views showing heat transfer from an adjacent though hole.
Figure 2B:
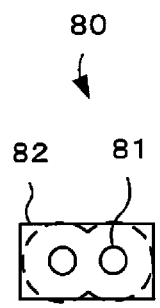

FIGS. 2A and 2B are views showing heat transfer from an adjacent though hole. In dip soldering, the board around the through hole is heated by solder filled in the through hole via an inner wall coating of the through hole 81 of the printed wiring board 80. This effect secure sufficient solder wetting in the area where many through holes are adjacent to each other, even with small cross section area of the through hole. FIGS. 2A and 2B are top vie of the printed wiring board, indicating images in that the printed wired board is heated by the heat transfer from the through hole 81. The temperature becomes higher as it approaches the center of broken line part. Numeral "82" denotes a configuration of a component.

Figure 3A:
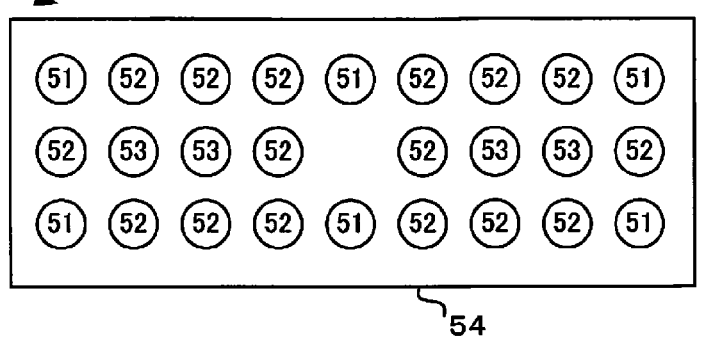
FIGS. 3A and 3B are views showing an embodiment of the present invention.
Figure 3B:
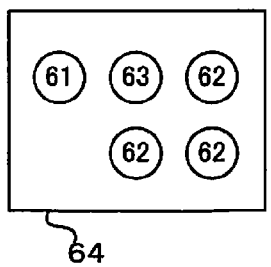

FIGS. 3A and 3B are views showing an embodiment of the present invention. FIG. 3A is a top view of the printed wiring board provided with through holes corresponding to pins (leads) of connectors arranged with 2.54 mm pitch. In the printed wiring board 50, through holes are provided into which leads of connectors arranged with 2.54 mm pitch are inserted. Numeral "54" denotes a configuration of the connector.

As shown in FIG. 3A, through holes into which the leads of the connector is inserted are provided in the printed wiring board 50. The through hole 51 has two adjacent through holes, the through hole 52 has three adjacent through holes, and the through hole 53 has four adjacent through holes.

When the through holes are provided in the printed wiring board 50 corresponding to connectors as shown in FIG. 3A, diameters of the through hole are decreased by ten percent as the adjacent through hole increases, securing sufficient solder wetting. When the diameter of the through hole 51 is 1, the diameter of the through hole 52 can be reduced to 0.9, and the through hole diameter of the through hole 53 can be reduced to 0.81. Here, the value of ten percent is an example.

There is a case where it is difficult to insert a lead to a narrow through hole with small cross section area, with poor accuracy of through hole positioning or lead pitch of the component. In this case, when the diameter of the through hole 51 is 1, the diameter of the through hole 52 may be 0.9, and the diameter of the through hole 53 may be 0.9. Thus, the printed wiring in the present embodiment includes a case where diameters of the through holes having more and less adjacent through holes are identical.

FIG. 3B is a top view of the printed wiring board provided with through holes corresponding to pins (leads) of sockets arranged with 2.54 mm pitch. In the printed wiring board 60, through holes are provided into which leads of sockets arranged with 2.54 mm pitch are inserted. Numeral "64" denotes a configuration of the socket.

As shown in FIG. 3B, through holes into which the lead of the sockets are inserted are provided in the printed wiring board 60. The through hole 61 has two adjacent through holes, the through hole 62 has three adjacent through holes, and the through hole 63 has four adjacent through holes.

When the through holes are provided in the printed wiring board 60 corresponding to connectors as shown in FIG. 3B, diameters of the through hole are decreased by ten percent as the adjacent through hole increases, securing sufficient solder wetting. When the diameter of the through hole 61 is 1, the diameter of the through hole 62 can be reduced to 0.9, and the diameter of the through hole 63 can be reduced to 0.81. Here, the value of ten percent is an example.

As above mentioned, a printed wiring board 50 or 60 includes three or more than three through holes. An inner wall of the through hole is covered by conductive coating. Same size leads of an electronic component are inserted into the through holes. The through holes are soldered by dip soldering in melting solder. The three or more than three through holes have one of two or more diameters, and the diameter of the through hole having more adjacent through holes is not larger than the diameter of the through hole having less adjacent through holes. The adjacent through hole is a through hole having the least distance between a center of the through hole and an adjacent through hole.

Figure 4:
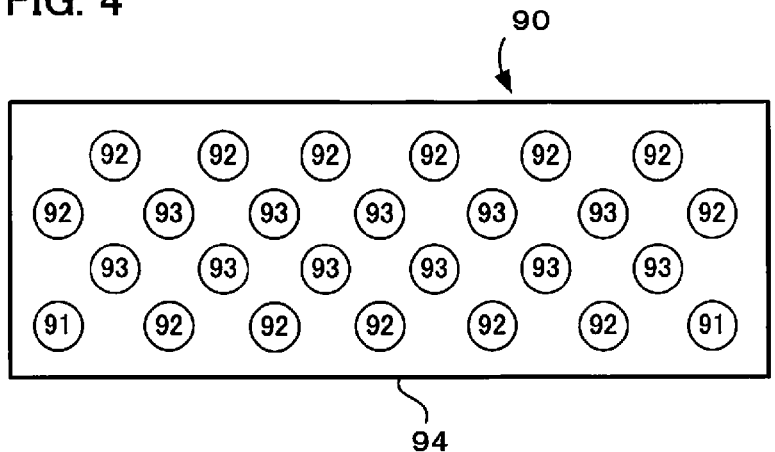
FIG. 4 is a view showing a printed wiring board on which a component is mounted, the leads of the component are arranged in diagonal direction.
Figure 5A:
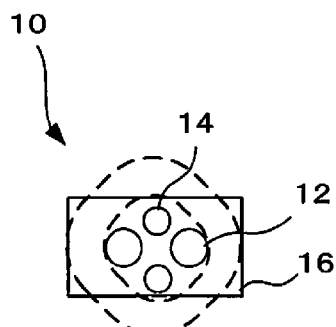
FIG. 5A, B are views explaining Japanese Patent Application Laid-Open No. 2007-305615.
Figure 5B:
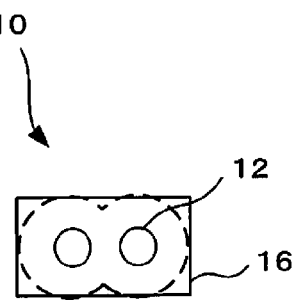
Figure 6:
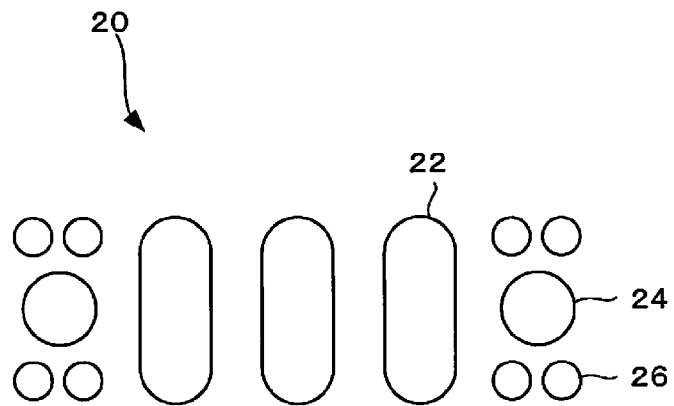
FIG. 6 is a view explaining Japanese Patent Application Laid-Open No. 2012-146903.
Figure 7:
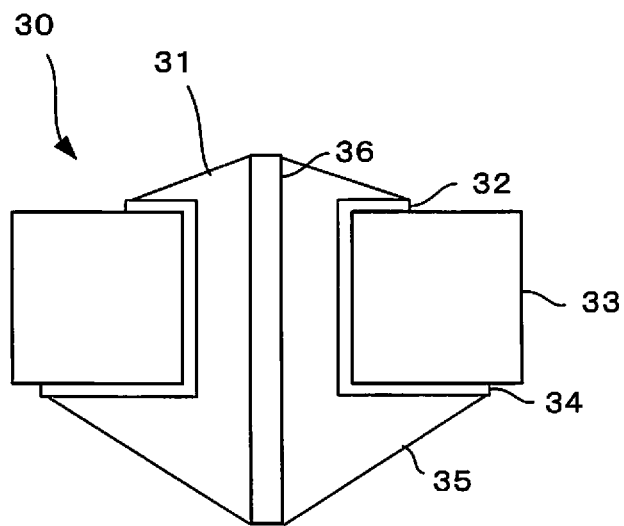
FIG. 7 is a view explaining Japanese Patent Application Laid-Open No. 2009-130262.
Figure 8:
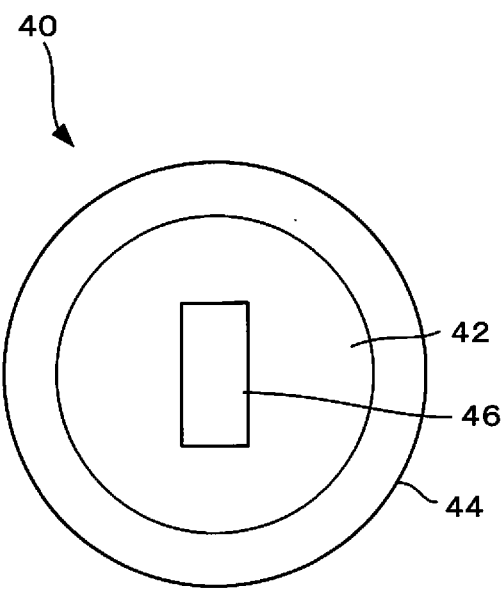
FIG. 8 is a view explaining Japanese Patent Application Laid-Open No. 2007-235044.

The leads of the electronic component such as a connector or a socket are regularly arranged with a constant pitch. The direction of the arrangement may be, vertical, horizontal, or diagonal in components. FIG. 4 is a view showing a printed wiring board on which a component is mounted, the leads of the component are arranged in diagonal direction. In the present invention, the adjacent through hole is a through hole of the above mentioned through holes that are regularly arranged, which the lead inserted into the adjacent through hole is the nearest lead to the lead inserted into the through hole.

As shown in FIG. 4, through holes into which the lead of the connector are inserted are provided in the printed wiring board 90. The through hole 91 has an adjacent through hole, the through hole 92 has two adjacent through holes, and the through hole 93 has four adjacent through holes. Numeral "94" denotes a configuration of a component.

The invention claimed is:

1. A printed wiring board comprising:
three or more than three through holes,
an inner wall of the through hole is covered by conductive coating,
into which same size leads of an electronic component are inserted,
configured to be soldered by dip soldering in melting solder, wherein
the three or more than three through holes have two or more diameters, and the diameter of the through hole having more adjacent through holes is not larger than the diameter of the through hole having less adjacent through holes.

2. A printed wiring board according to claim 1, the adjacent through hole is a through hole having the least distance between a center of the through hole and a center of the adjacent through hole.

* * * * *